(12) United States Patent
Birnstock et al.

(10) Patent No.: US 7,915,815 B2
(45) Date of Patent: Mar. 29, 2011

(54) TRANSPARENT LIGHT-EMITTING COMPONENT

(75) Inventors: Jan Birnstock, Dresden (DE); Sven Murano, Dresden (DE); Martin Vehse, Dresden (DE)

(73) Assignee: Novaled AG, Dresden (DE)

( * ) Notice: Subject to any disclaimer, the term of this patent is extended or adjusted under 35 U.S.C. 154(b) by 632 days.

(21) Appl. No.: 11/908,302

(22) PCT Filed: Mar. 2, 2006

(86) PCT No.: PCT/DE2006/000380
§ 371 (c)(1),
(2), (4) Date: Sep. 11, 2007

(87) PCT Pub. No.: WO2006/097069
PCT Pub. Date: Sep. 21, 2006

(65) Prior Publication Data
US 2009/0267490 A1 Oct. 29, 2009

(30) Foreign Application Priority Data
Mar. 11, 2005 (EP) ...................................... 05005386

(51) Int. Cl.
*H05B 33/28* (2006.01)
(52) U.S. Cl. ...................................... 313/506; 313/504
(58) Field of Classification Search .......... 313/498–512; 315/169.3; 345/36, 45, 76
See application file for complete search history.

(56) References Cited

U.S. PATENT DOCUMENTS 5,834,893 A 11/1998 Bulovic et al.
6,046,543 A 4/2000 Bulovic
(Continued)

FOREIGN PATENT DOCUMENTS

EP 1076368 2/2001
(Continued)

OTHER PUBLICATIONS

Aegerter, M.A. et al. "Wet-Chemical Processing of Transparent and Antiglare Conducting ITO Coating on Plastic Substrates," J. of Sol-Gel Science and Technology, 27, 81-29 (2003).

(Continued)

*Primary Examiner* — Nimeshkumar D. Patel
*Assistant Examiner* — Christopher M Raabe
(74) *Attorney, Agent, or Firm* — Sutherland, Asbill & Brennan, LLP (57) ABSTRACT

The invention relates to a transparent light-emitting component, in particular organic light-emitting diode, having a transparent layer arrangement in which are formed, on a substrate in a stack, planar electrodes and an organic region arranged between the planar electrodes, which organic region comprises a light-emitting layer, made from one or a plurality of organic materials. For at least one direction of incidence, a transmittance of the transparent layer arrangement for at least one wavelength subrange in the visible spectral range is greater than 50%. One of the planar electrodes has a metal layer having a thickness of less than 40 nm, and another of the planar electrodes, which is arranged opposite to the electrode in the layer arrangement, has an oxide layer made from an electrically conductive oxide material having a thickness of at least 10 nm, an intensity ratio of at least 2:1 being formed for a light emission emerging on one side of the transparent layer arrangement and a light emission emerging on an opposite side of the transparent layer arrangement.

19 Claims, 4 Drawing Sheets

U.S. PATENT DOCUMENTS

| | | | |
|---|---|---|---|
| 6,111,696 | A | 8/2000 | Allen et al. |
| 6,160,828 | A | 12/2000 | Kozlov et al. |
| 6,331,356 | B1 | 12/2001 | Angelopoulos et al. |
| 6,356,032 | B1 | 3/2002 | Suzuki et al. |
| 6,614,161 | B1 | 9/2003 | Jacobsen et al. |
| 6,652,981 | B2 * | 11/2003 | Lennhoff et al. ............ 428/472 |
| 6,878,297 | B1 | 4/2005 | Berger |
| 2002/0079832 | A1 | 6/2002 | Van Tongeren et al. |
| 2003/0085652 | A1 | 5/2003 | Weaver et al. |
| 2003/0184219 | A1 | 10/2003 | Duggal et al. |
| 2004/0033388 | A1 | 2/2004 | Kim et al. |
| 2004/0066824 | A1 | 4/2004 | Magno |
| 2004/0069995 | A1 | 4/2004 | Magno |
| 2004/0081855 | A1 * | 4/2004 | Kim et al. ................ 428/690 |
| 2004/0247875 | A1 | 12/2004 | Ootsuka et al. |
| 2005/0041293 | A1 | 2/2005 | Wada et al. |
| 2005/0179399 | A1 | 8/2005 | Leo et al. |
| 2006/0033115 | A1 | 2/2006 | Blochwitz et al. |
| 2009/0051271 | A1 | 2/2009 | Birnstock et al. |

FOREIGN PATENT DOCUMENTS

| | | |
|---|---|---|
| EP | 1100129 | 5/2001 |
| JP | 7057873 | 3/1995 |
| JP | 2000223277 | 8/2000 |
| JP | 2001052878 | 2/2001 |
| JP | 2002278477 | 9/2002 |
| JP | 2003059642 | 2/2003 |
| JP | 2003249125 | 9/2003 |
| JP | 2004235168 | 8/2004 |
| JP | 2005108672 | 4/2005 |
| JP | 2002216975 | 6/2007 |
| TW | 200306437 | 11/2003 |
| TW | I226499 | 1/2005 |
| WO | 96/19792 | 6/1996 |
| WO | 98/28767 | 7/1998 |
| WO | 03/004571 | 1/2003 |
| WO | 03083958 | 10/2003 |
| WO | 2004/004421 | 1/2004 |
| WO | 2005/051525 | 6/2005 |

OTHER PUBLICATIONS

Burroughes, J. H., et al., "Light-emitting diodes based on conjugated polymers" Nature, vol. 347, Oct. 11, 1990, pp. 539-541.
Carter, S. A. et al., "Enhanced luminance in polymer composite light emitting devices." Appl. Phys Lett vol. 71 pp. 1145-1147, Sep. 1997.
Deshpande, R.S., "White-light-emitting organic electroluminescent devices based on interlayer sequential energy transfer." Applied Physics Letters, vol. 75, No. 7, Aug. 16, 1999, pp. 888-890.
Donley, C. et al "Characterization of Indium—Tin Oxide Interfaces Using X-ray Photoelectron Spectroscopy and Redox Processes of a Chemisorbed Probe Molecule Effect of Surface Pretreatment Conditions," Langmuir, 18. 450-457 (2002).
Gu, G. et al., "Transparent organic light emitting devices." Applied Physics Letters, (1996), vol. 68.19. pp. 2606-2608.
Gufeng, HE et al , "High-efficiency and low-voltage p-i-n electrophosphorescent organic light-emitting diodes with double-emission layers." Applied Physics Letters, vol. 85, No. 17, Oct. 25, 2004, pp. 3911-3913.
Macleod, H.A., Thin Film Optical Fibers, 3rd Ed. IOP Publishing, 2001, pp. 191-192.
Parthasarathy, G. et al., "High-efficiency transparent light-emitting devices." Applied Physics Letters, vol. 76, 15, Apr. 10, 2000, pp. 2128-2130.
Sohn, M.N. et al "Super-smooth indium-tin oxide thin films by negative sputter ion beam technology." J Vac Sci Technol. A 21(4), Jul./Aug. 2003.
Tak. Y et al "Criteria for ITO (indium-tin-oxide) thin film as the bottom electrode of an organic light emitting diode," Thin Solid Films, 411, 12-16 (2002).
Tang, C.W. et al., "Organic electroluminescent diodes," Applied Physics Letters, vol. 51, No. 12, Sep. 21, 1987, pp. 913-915.
International Search Report for PCT/EP2007/007673; Apr. 4, 2008.
Notice of Allowability, U.S. Appl. No. 11/420,346; Aug. 21, 2009.
Notice of Allowance; U.S. Appl. No. 11/420,346; May 8, 2009.
Non-Final Office Action; U.S. Appl. No. 11/420,346; Dec. 9, 2008.
Final Office Action; U.S. Appl. No. 11/420,346; Apr. 17, 2008.
Non-Final Office Action; U.S. Appl. No. 11/420,346; Aug. 3, 2007.
European Search Report; EP 06009885.2; Oct. 8, 2008.
Korean Search Report (English Translation); KR20060122742; Application No. KR 2006004075, Jun. 25, 2007.
Japanese Search Report (English Translation); JP 2006148615; May 15, 2009.
Taiwanese Search Report Report; TW095117553; May 27, 2005.
Disclosure Under 37 CFR 1.56 for U.S. Appl. No. 11/908,302 (Submitted Herewith).
Falbe, Jurgen and Regitz, MANFRED; Rompp Lexicon Chemie; 10. Auflage; T-Z.
Fluxin, ETFOX Enginering Software for Emissive Thil Film Optics Simulation, User Manual, Version 1.3, 2006.
Japanese Office Action in JP 2008-500038, received Sep. 7, 2010.
Japanese Office Action in Counterpart Application # 2008-500038 (English Translation).

* cited by examiner

TRANSPARENT LIGHT-EMITTING COMPONENT

The invention relates to a transparent light-emitting component, in particular an organic light-emitting diode, having a transparent layer arrangement in which are formed, on a substrate in a stack, planar electrodes and an organic region arranged between the planar electrodes, which organic region comprises a light-emitting layer, made from one or a plurality of organic materials.

PRIOR ART

Organic light-emitting diodes (OLED) have increasingly been drawing attention in recent years on account of their high potential for applications in the area of illumination and the display of information. In this case, a multiplicity of aspects of organic light-emitting diodes are of importance, inter alia their potential for high power efficiencies, their usability on flexible substrates, their colour emission controllability and also the possibility of using transparent OLEDs as illumination elements or display elements. As surface radiators, in particular, OLEDs are fundamentally different from known illumination techniques, for example inorganic light-emitting diodes, incandescent lamps or fluorescent tubes. They represent a completely new technology which can extend the diversity of applications.

A realization of window panes based on transparent OLEDs would be one such application, the transmittance for light incident on the OLED usually being used as a measure of the transparency of the OLED. Window panes of this type would make it possible to provide architectonically illumination elements which, on the one hand, utilize daylight but, on the other hand, can also be luminous independently. Likewise of interest are transparent displays which can for example be incorporated in windscreens of means of transport and supply the driver of the means of transport with information. Furthermore, it is desired to place transparent illumination or display elements in front of objects the view of which is intended to remain unobstructed. Thus, in a vehicle, by way of example, it is possible to position in front of the speedometer a transparent display which warns the driver for example of an applied handbrake but is otherwise turned off.

With such a use of transparent OLEDs, however, a proportion of approximately 50% of the emitted light is lost since the light generated in the light-emitting organic region of the OLED is usually emitted approximately in equal portions by the two OLED outer areas on the top side and the underside. This drastically reduces the effectiveness of the illumination element or the brightness of the display, as a result of which a possible commercial application is made more difficult.

Transparent OLEDs are already known as such, based on the use of two transparent electrodes, which may comprise for example conductive glasses such as ITO or thin metals or combinations thereof. In contrast to transparent OLEDs, traditional OLEDs are provided with precisely one transparent electrode, while the second electrode comprises a reflective metal, as a result of which the light is emitted exclusively by the transparent electrode.

There are efforts to combine transparent OLEDs with so-called switchable mirrors. In this case, the mirror is switched on together with the OLED and the entire light from the OLED is transmitted in the same direction, this variant is very complicated and cost-intensive.

There is also yet another approach, according to which semitransparent organic light-emitting diodes are constructed which have a highly transparent electrode and a less transparent electrode due to high absorption losses. In this case, a larger quantity of light is emitted by the highly transparent electrode. However, in this approach, the unequal light emission is only acquired through absorption in the less transparent electrode, that is to say that a reduction of the efficiency of the OLED takes place. What is more, the total transmittance of the OLED is vitiated due to the lower transparency of one electrode. A simplified computational example will illustrate this: assuming that the organic layers have a transmittance of 1, one electrode has a transmittance of 0.6 and the second electrode has a transmittance of 0.9, the OLED has to a first approximation a transmittance of just over 50%. Of all the photons which leave the component, two fifths are emitted by one electrode and three fifths by the other electrode. 25% of the photons which would also have left the component are absorbed in the electrodes. If, instead of a ratio of the emitted light intensities on the two sides of the component of 2:3, a ratio of 1:4 is then intended to be realized, it would already be necessary to utilize electrodes having a transmittance of 0.9 and 0.22. The transmittance of the component would then be only 20% and 44% of the photons that would actually leave the component are absorbed in the electrodes. The transmittance of 90% for the electrode having higher transparency was used in this calculation since this already represents a very high value for transparent and conductive electrodes. 95% is also achievable under particularly ideal conditions, but this does not fundamentally change anything in the calculation.

The document EP 1 076 368 A2 describes an organic light-emitting diode, in which is formed a transparent layer arrangement with a substrate, two planar electrodes and also an organic region arranged in between. The organic region comprises a light-emitting layer made from a plurality of organic materials. In an example C, a cathode is formed from silver with a thickness of 20 nm. An anode is made from ITO. An oxide layer made from MgO having a thickness of 56 nm is arranged on the metal layer.

The document U.S. Pat. No. 6,356,032 B1 discloses an organic electroluminescent component, in which an anode is made from a transparent conductive material, for example ITO. A cathode is made from a metallic material, for example Al. Furthermore, a hole injection layer, a hole transport layer, an electron transport layer and an electron injection layer are arranged between the anode and the cathode.

The document US 2003/0184219 A1 discloses an electroluminescent component applied on a flexible substrate. A surface of the flexible substrate is coated with a multilayer barrier comprising at least one lower layer made from an essentially transparent organic polymer and at least one further lower layer made from an essentially transparent inorganic material.

The document EP 1 100 129 A2 describes a substrate for a light-emitting component, comprising an electrically conductive and transparent film that is in contact with a surface of an element having a low refractive index, the refractive index being greater than 1 and less than 1.3.

THE INVENTION

It is an object of the invention to provide a transparent light-emitting component, in particular an organic light-emitting diode, by means of which the application possibilities for transparent light-emitting components are extended.

This object is achieved according to the invention by means of a transparent light-emitting component according to independent claim 1. Dependent subclaims relate to advantageous refinements of the invention.

The invention provides a transparent light-emitting component, in particular organic light-emitting diode, having a transparent layer arrangement in which are formed, on a transparent substrate in a stack, planar electrodes and an organic region arranged between the planar electrodes, which organic region comprises a light-emitting layer, made from one or a plurality of organic materials. For at least one direction of incidence, a transmittance of the transparent layer arrangement for at least one wavelength subrange in the visible spectral range is greater than 50%. One of the planar electrodes has a metal layer having a thickness of less than 40 nm, and another of the planar electrodes, which is arranged opposite to the electrode in the transparent layer arrangement, has an oxide layer made from an electrically conductive oxide material having a thickness of at least 10 nm, an intensity ratio of at least 2:1 being formed for a light emission emerging on one side of the transparent layer arrangement and a light emission emerging on an opposite side of the transparent layer arrangement.

One or a plurality of doped charge carrier transport layers are formed in the organic region.

The invention provides a transparent light-emitting component, in particular an organic light-emitting diode (OLED), which combines a preferred emission of the light by one of the two electrodes with a high total transparency of the component in at least one direction of incidence. Such a component may be used in particular as an illumination element which demarcates building interior spaces from the outside world, for example in the form of a windowpane. These components can then supply the building interior with light while daylight is incident, without the light-emitting component being in an operating state. When daylight decreases, the component can then be switched on, the light generated preferably being emitted into the building interior, as a result of which the utilization of the luminous power is considerably improved. Furthermore, it is possible to use a corresponding component in other areas of application as well, for example individually or as a combination of a plurality of light-emitting components in an active or passive display element or a display or else in an illumination apparatus, for example in vehicles or as space illumination.

The invention furthermore has the advantage over the prior art that a large part of the light generated in the light-emitting organic region is not lost on account of absorption.

In a further embodiment of the invention, the electrode and/or the other electrode is a multilayer electrode.

In a preferred embodiment, the multilayer electrode comprises at least one oxide layer made from an electrically conductive oxide material and at least one metal layer.

In a further embodiment of the invention, the multilayer electrode comprises a plurality of oxide layers made from in each case an electrically conductive oxide material and/or a plurality of metal layers.

In a preferred embodiment, one or all of the oxide layers of the multilayer electrode have a thickness of at least 10 m.

In a preferred embodiment, one or all of the metal layers of the multilayer electrode have a thickness of less than 40 nm.

In a further embodiment of the invention, a coupling-out layer for coupling out light is formed on the electrode and/or the other electrode.

In a preferred embodiment, the coupling-out layer is electrically conductive.

In a preferred embodiment, the coupling-out layer is made from an organic material.

In a further embodiment of the invention, the coupling-out layer has a refractive index of at least 1.3.

In a preferred embodiment, the coupling-out layer has a refractive index of at least 1.6.

In a preferred embodiment, a coupling-out layer is applied on a side of the transparent substrate which is remote from the organic region.

In a further embodiment of the invention, the coupling-out layer is formed by means of a coupling-out film.

In a further embodiment of the invention, for the at least one direction of incidence, the transmittance of the transparent layer arrangement for at least one wavelength subrange in the visible spectral range is greater than 60%.

In a preferred embodiment, for the at least one direction of incidence, the transmittance of the transparent layer arrangement for at least one wavelength subrange in the visible spectral range is greater than 70%.

In a preferred embodiment, for the at least one direction of incidence, the transmittance of the transparent layer arrangement for at least one wavelength subrange in the visible spectral range is greater than 80%.

In a further embodiment of the invention, for the at least one direction of incidence, the transmittance of the transparent layer arrangement for at least one wavelength subrange in the visible spectral range is greater than 90%.

In a preferred embodiment, an intensity ratio of at least 3:1 is formed for the light emission emerging on one side of the transparent layer arrangement and the light emission emerging on the opposite side of the transparent layer arrangement.

In a preferred embodiment, an intensity ratio of at least 5:1 is formed for the light emission emerging on one side of the transparent layer arrangement and the light emission emerging on the opposite side of the transparent layer arrangement.

In a preferred embodiment, an intensity ratio of at least 8:1 is formed for the light emission emerging on one side of the transparent layer arrangement and the light emission emerging on the opposite side of the transparent layer arrangement.

In a further embodiment of the invention, an additional layer having a refractive index of less than 1.4 is formed between the transparent substrate and a planar electrode facing the transparent substrate.

In a preferred embodiment, in the case of the electrode, the oxide layer made from the electrically conductive oxide material may have a thickness of at least 15 nm, preferably of at least 25 nm, in a preferred manner of at least 40 nm, or more preferably of at least 60 nm. Higher layer thicknesses can be produced more reliably and facilitate the current supply.

In expedient refinements of the invention, it is provided that, in the case of the other electrode, the metal layer has a thickness of less than 30 nm, preferably of less than 20 nm or in a preferred manner of less than 10 nm. The transmittance increases as the layer thickness decreases.

EXEMPLARY EMBODIMENTS

The invention is explained in more detail below on the basis of exemplary embodiments with reference to the figures of a drawing, in which.

Figure 1:
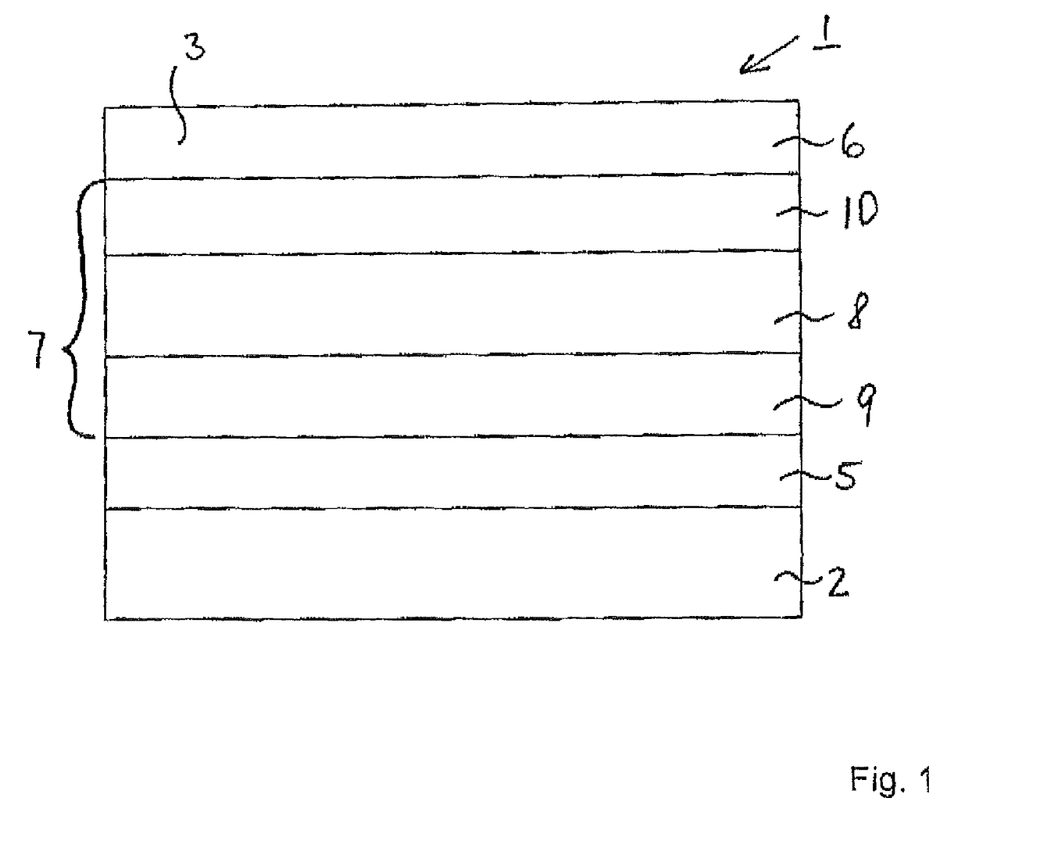
FIG. 1 shows a schematic illustration of a transparent light-emitting component having a transparent layer arrangement.

FIG. 1 shows a schematic illustration of a transparent light-emitting component in the form of an organic light-emitting diode (OLED) having a transparent layer arrangement 1 in which are formed, on a transparent substrate 2 in a stack 3, planar electrodes 5, 6 and an organic region 7 arranged between the planar electrodes 5, 6, which organic region comprises a light-emitting layer 8, made from one or a plurality of organic materials. The organic region 7 furthermore comprises charge carrier transport layers 9, 10, which may or may not be provided with a doping. Moreover, the organic region 7 may comprise further layers (not illustrated) as are known as such for organic light-emitting diodes, for example blocking layers. The light-emitting layer 8 may be embodied in monolayer or multilayer fashion.

By means of the doping of the charge carrier transport layers 9, 10, on the one hand the charged carrier transport is not dependent on the layer thickness, which permits a free choice of the layer thicknesses used and enables the layer construction to be optimized with regard to the desired coupling-out behaviour. On the other hand, the doping of the charge carrier transport layers 9, 10 eliminates the limitation of the materials that can be used for the electrodes 5, 6 such as exists in the case of OLEDs having undoped transport layers. An adaptation of the work function of the electrode to the energy levels of the adjoining organic layer is not necessary on account of the doping, so that the electrode material can be chosen freely on both sides of the OLED.

The light-emitting component illustrated in FIG. 1 may be embodied as an inverted structure or as a noninverted structure, thereby defining which of the two planar electrodes 5, 6 is an anode or a cathode.

One of the planar electrodes 5, 6 comprises a metal layer having a thickness of less than 40 nm and the other of the planar electrodes 5, 6, which is arranged opposite to the electrode in the transparent layer arrangement 1, has an oxide layer made from an electrically conductive oxide material having a thickness of at least 10 nm. An intensity ratio of at least 2:1 is formed for a light emission emerging on one side of the transparent layer arrangement 1 and a light emission emerging on an opposite side of the transparent layer arrangement 1. A transmittance of the transparent layer arrangement 1 for at least one wavelength subrange in the visible spectral range is greater than 50% for at least one direction of incidence.

In order to realize an organic light-emitting diode, as is illustrated schematically in FIG. 1, with preferred light emission on one side of the component in conjunction with a high total transmittance, it is necessary for both electrodes 5, 6 to be configured as transparent or semitransparent contacts. For this purpose, it is possible to form electrodes made from transparent conductive glasses such as, for example, indium tin oxide (ITO), indium zinc oxide (IZO), thin metals such as aluminium, gold, silver, calcium, magnesium, chromium, ytterbium, molybdenum, tantalum or the like, and also from combined multilayer sequences thereof, for example ITO-metal-ITO stacks. The microcavities arising between the electrodes 5, 6, in particular with regard to the generated light and the propagation thereof, are optimized such that a light emission by the desired electrode is optimized, whereas a light emission by the opposite electrode is reduced, as is explained in more detail below on the basis of exemplary embodiments.

The exemplary embodiments presented below for further elucidation of the invention were initially calculated with the aid of a computer simulation, and then the correspondence between the theoretically determined results and OLEDs that have actually been produced and measured was checked and confirmed on selected examples.

Provision may be made for further optimizing the coupling-out of light by the desired one of the electrodes 5, 6 by means of suitable measures, for example by means of using a coupling-out film, an antireflective layer or the like, as a result of which, on the one hand, the ratio of the emissions by front side and rear side is increased further and, on the other hand, if appropriate, the total transparency of the component is also improved.

The efficiency of the component can furthermore be improved by introducing a further layer (not illustrated) having a refractive index of less than 1.4 between the transparent substrate and the planar electrode facing the transparent substrate. By means of this layer, the coupling-out of the emitted light from the organic region into the substrate is supported and, if appropriate, the emission ratio is also increased.

In one exemplary embodiment, provision is made of an ITO layer on a glass substrate having a thickness of 60 nm as transparent electrode, and a thin metal layer as semitransparent counterelectrode. For the metal layer to be semitransparent, it must be chosen to be sufficiently thin. However, this is not possible for every metal without the conductivity of the layer being reduced to an excessively great extent. By way of example, in the case of aluminium layers, the layer thickness of the metal must be less than 4 nm in order to achieve a total transparency of the layer arrangement of 50%. However, such a thin layer would not suffice to supply the component with the necessary current via this electrode.

In order to keep the total transmittance of the component at 50% despite a thicker aluminium layer, an additional layer having a refractive index of greater than 1.3 may be applied on the side remote from the OLED. This additional layer serves as a type of coupling-out layer or antireflective layer and simultaneously reduces the absorption of the light mode in the metal layer. The additional layer may be an organic layer that is transparent in the visible spectral range, such as, for example, MeO-TPD (N,N,N',N'-tetrakis(4-methoxyphenyl) benzidine) or spiro-TAD (2,2',7,7'-tetrakis-(N,N-diphenylamino)-9,9'-spirobifluorene), which have a refractive index of approximately 1.7 in the visible spectral range. With the aid of an 80 nm thick MeO-TPD layer, an Al thickness of 8 nm may be used in order to obtain a total transmittance of 50%. This effect becomes greater the higher the refractive index of the material used.

A particularly advantageous embodiment of the additional layer is formed if the latter is not only transparent in the visible spectral range but is also electrically conductive, which is the case for many metal oxides, for example ITO, IZO, ZnO, $TiO_2$. This has the advantage that the electrical conductivity now results from the metal layer and the additional layer. For the already mentioned case of the 5 nm thick Al layer in combination with a 40 nm thick ITO layer, this would mean that this layer has a sufficiently high conductivity. A sufficiently high conductivity is understood to mean a sheet resistance of the electrode of less than 200 ohm/square, preferably less than 30 ohm/square. The total transmission of the OLED is even 70% on account of the high refractive index of ITO, which is 1.8 to 2 in the visible spectral range. Furthermore, the possibility exists in this case of varying both the total transmittance, the emission ratio and the efficiency of the component by means of varying the layer thicknesses of ITO and Al. In the case of a transparent red OLED with an emission peak at 630 nm, by way of example, an increase in the Al thickness from 5 nm to 8 nm leads to a decrease in the total transmission from 70% to 55%. The emission ratio, measured on the basis of the intensity of the emitted light on the top side and the substrate side of the component, changes, however, from 1:5 to 1:10 in conjunction with an increase in the efficiency of the component by 40% on the substrate side.

By means of applying a coupling-out layer of the substrate side remote from the organic region, the efficiency and hence also the emission ratio can again be significantly improved, depending on the efficiency of the coupling-out layer. By way of example, improvements of 40% can be achieved with a simple diffusing film.

A doping of the charge carrier transport layers 9, 10 (cf. FIG. 1) proves to be particularly advantageous since arbitrary metals can then be chosen as electrode 5, 6 without having to take account of the work function of the respective metal. Consequently, metals which, for the required transparency, still have a sufficiently good conductivity of the layer can be used in a targeted manner. Thus, an Ag electrode can be used instead of the Al electrode. With a thin Ag layer of 15 nm which has a sufficient electrical conductivity for the operation of the OLED, it is possible to achieve a total transmittance of the component of above 50%. If the layers in the organic region of the OLED are coordinated with this electrode configuration, then an emission ratio of up to 1:10 (top side: substrate side) can be realized for example for a red OLED.

In this case, too, it is possible, as described above, to improve the total transmission of the OLED by means of applying an additional layer to the Ag electrode. With the aid of a 40 nm thick Meo-TPD layer, it can be increased from 50% to 70% to 80%. However, in the case of a red OLED, for example, the emission ratio is also altered from 1:10 to 1:6.

In this case, too, the total transmittance, the emission ratio and the efficiency of the OLED can be varied with the aid of a small alteration of the Ag layer thickness. By way of example, in the case of changing the Ag thickness from 15 nm to 25 nm and coordinating the layers in the organic region of the component with the electrode configuration with a 40 nm thick additional layer, the total transmittance of the component is reduced from 70% to 80% to 50%. The emission ratio, by contrast, is improved from 1:6 to 1:14 with an increase in efficiency of 40% on the substrate side.

As in the case of the Al electrode, it is possible in this case, too, to work with other additional layers having a higher refractive index than Meo-TPD, and the efficiency and the emission ratio of the OLED can be modified in a targeted manner.

Besides the combination of metal layer and ITO additional layer, a further variant is to replace the contact by an ITO/metal/ITO (IMI) layer sequence. By means of the choice of layer thicknesses, it is thus possible to produce extremely transparent electrodes which nevertheless have a sufficiently good reflectance to result in a directional emission. By way of example, a total transmittance of the OLED of 80% to 90% in the visible spectral range was achieved with a 60 nm ITO bottom electrode on the glass substrate and an IMI electrode comprising 5 nm ITO/5 nm Ag/135 nm ITO. The emission ratio of a red OLED is in this case 1:5 (top side:substrate side). If the thickness of the Ag layer is increased to 10 nm, the total transmittance of the OLED decreases to 60% to 80%, but the emission ratio increases to 1:9, and the efficiency of the OLED in the preferred emission direction increases by 26%.

According to the principle of the semitransparent metal contact with an additional layer, a total transmittance of the component of 90% in the red spectral range was achieved in the case of a red OLED comprising a 15 nm thick Au contact and a 50 nm thick Meo-TPD additional layer with an emission ratio of 3:1. Since the transmission band is significantly narrower than the entire visible spectral range, it is possible, by means of a suitable choice of contact layer thickness and additional layer thickness, to shift the maximum transmission to a specific location in the visible spectrum, and the transparent light-emitting component thus serves as a type of colour filter. By way of example, the transmission maximum may be shifted into the green spectral range, where the sensitivity of the human eye is highest. The OLED is red or blue, however, and thus has a better reflection at the electrode and consequently a more highly directional emission characteristic. In the case of a 60 nm thick ITO electrode on the glass substrate and a 15 nm Au counterelectrode with a 160 nm thick Meo-TPD additional layer, a blue OLED optimized with regard to the layer thicknesses, with an emission peak at 450 nm, achieves a total transmittance of 60% in the spectral range between 420 and 600 nm. This OLED has an emission ratio of 1:5 (top side:substrate side). By means of simply reducing the additional layer, the transmittance increases to 80% in the green spectral range and decreases to below 60% in the blue spectral range. The emission ratio rises to 1:6, and the efficiency of the OLED in the preferred emission direction rises by 27%.

This effect is additionally intensified if the Meo-TPD layer is replaced by a layer having a higher refractive index, for example a layer made of $TiO_2$ or ZnS. In the case of a 180 nm thick $TiO_2$ layer, the transmittance increases to 80% in the green spectral range and decreases to below 50% in the blue and red spectral ranges. In this case, too, the emission ratio is 1:6.

As already explained, extensive freedom in the choice of material for the electrodes is achieved by means of doping the charge carrier transport layers. This means that it is also possible for the two electrodes to be interchanged with one another. By way of example, a 15 nm thick Ag layer may be applied to the glass substrate, and, after the application of the organic layers, an 80 nm thick ITO layer is sputtered as electrode onto the OLED. The advantage of this design consists in the fact that the glass substrate, on account of its refractive index of 1.45 in the visible spectral range, already performs the above-described function of the additional layer. As a result, the total transmittance of the OLED is already 75%, but the emission ratio in both directions is virtually identical. By means of increasing the Ag thickness to 21 nm, although the total transmission is reduced to 55%, the emission ratio is improved to 2:1.

The use of an ITO/metal/ITO electrode is not always advantageous. Although a top electrode comprising 5 nm ITO/10 nm Ag/65 nm ITO and a 15 nm thick Ag electrode on the substrate side would improve the conductivity of the electrode and nevertheless achieve a total transmittance of 70%, the emission ratio in both directions would again be approximately identical. In order to bring the emission ratio to 2:1 given a total transmission of more than 50%, the Ag thickness on the substrate side would have to be 20 nm.

Figure 2:
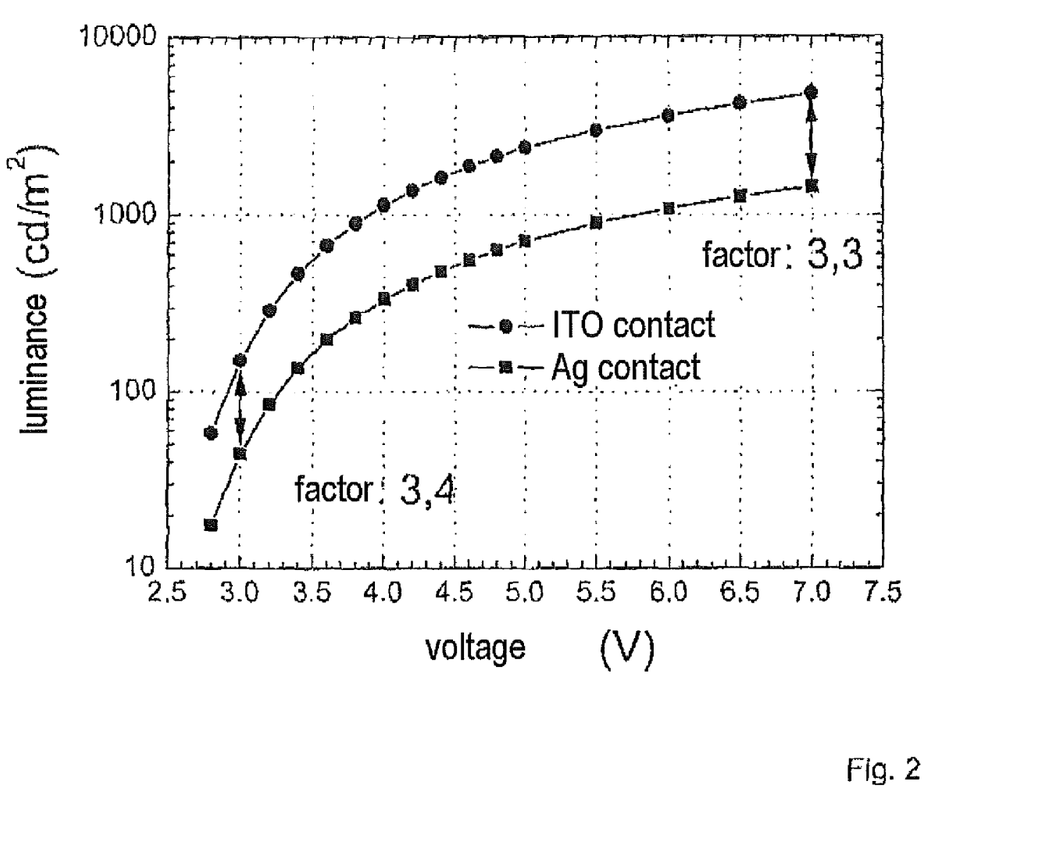
FIG. 2 a graphical illustration of the luminance as a function of the voltage for a transparent light-emitting component according to one exemplary embodiment.
Figure 3:
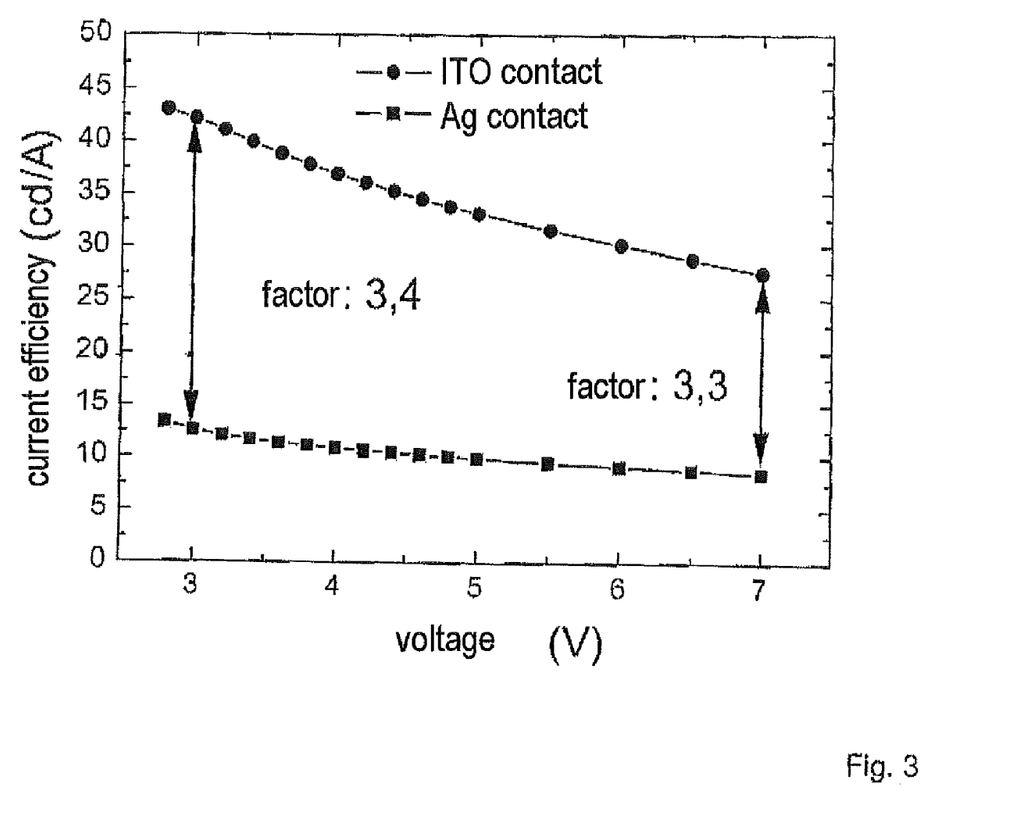
FIG. 3 shows a graphical illustration of the current efficiency as a function of the voltage for the transparent light-emitting component according to the exemplary embodiment.
Figure 4:
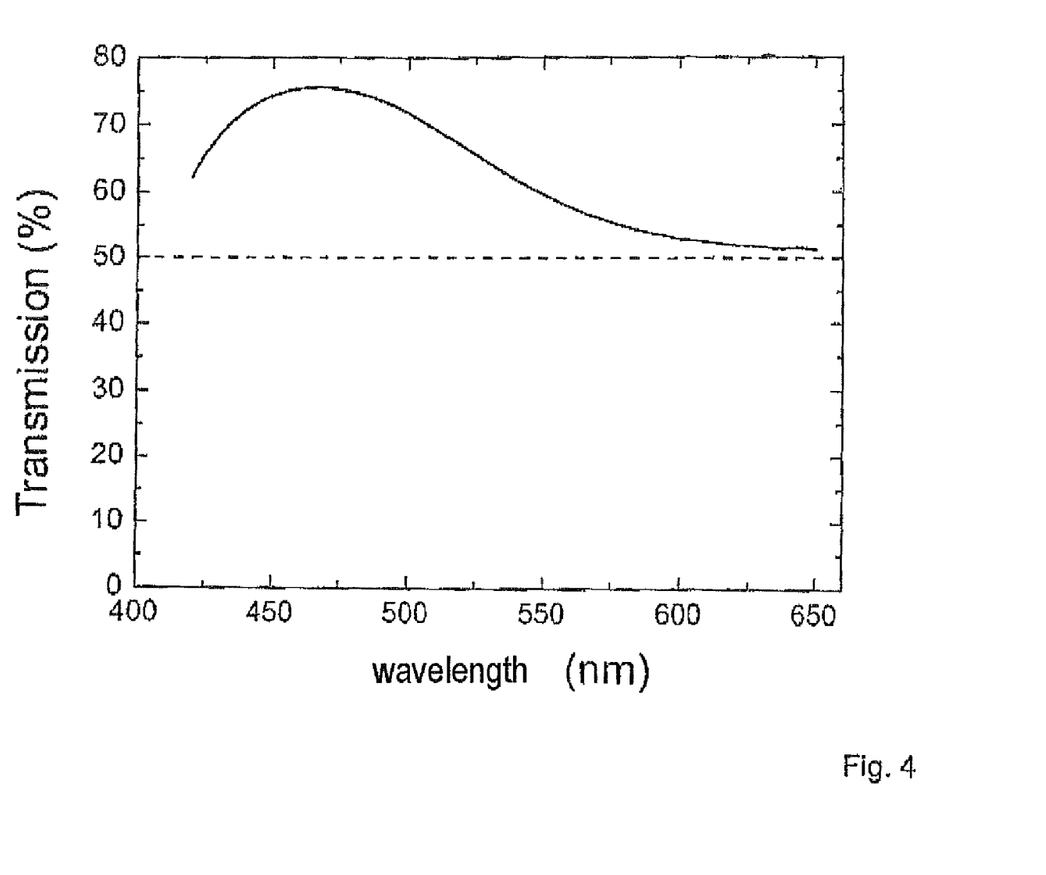
FIG. 4 shows a graphical illustration of the transmittance as a function of the wavelength for the transparent light-emitting component according to the exemplary embodiment.

Further exemplary embodiments are explained in detail below with reference to FIGS. 2 to 4.

An organic light-emitting component was produced as follows. A glass substrate coated with ITO was patterned and cleaned in order to form the bottom electrode. The thickness of the ITO layer is approximately 130 nm given a sheet resistance of approximately 20Ω/✓. The following layers were applied successively by means of thermal vaporization in vacuo at a pressure of approximately $10^{-7}$ mbar, the vacuum not having been broken:
1) 65 nm N,N,N',N'-tetrakis(4-methoxyphenyl)-benzidine (MeO-TPD) doped with 2,3,5,6-tetrafluoro-7,7,8,8-tetracyanoquinodimethane (F4-TCNQ) in a molecular ratio of 50:1 as p-doped hole transport layer;
2) 10 nm 2,2',7,7'-tetrakis-(N,N-diphenylamino)-9,9'-spirobifluorene (Spiro-TAD) as intermediate layer;
3) 6 nm 4,4',4''-tris(N-carbazolyl)triphenylamine (TCTA) doped with 8% fac-tris(2-phenylpyridine)iridium (Ir(ppy)$_3$) based on the mass;
4) 12 nm 3-phenyl-4-(18-naphthyl)-5-phenyl-1,2,4-triazole (TAZ) doped with 8% fac-tris(2-phenylpyridine)iridium (Ir(ppy)$_3$) based on the mass;
5) 10 nm bathophenanthroline (Bphen) as intermediate layer;
6) 50 nm Bphen doped with Cs in a molecular ratio of 1:1 as n-doped electron transport layer;
7) 15 nm silver as cathode; and
8) 45 nm MeO-TPD as top layer.

This transparent green pin-OLED exhibits an emission maximum at approximately 520 nm. At an applied voltage of 7 V, the emission brightness is 4800 cd/m$^2$ upon measurement by means of the ITO bottom electrode, whereas it is 1400 cd/m$^2$ upon measurement by means of the Ag top electrode. This corresponds to an emission ratio of 3.4 (cf. FIG. 2), which is also reproduced by the ratio of the current efficiency (cf. FIG. 3). The transmittance of this embodiment is up to approximately 70% in the visible range (cf. FIG. 4).

A further organic component was produced as follows. A glass substrate coated with ITO was patterned and cleaned. The thickness of the ITO is approximately 130 nm given a sheet resistance of approximately 20Ω/▯. The following layers were applied successively by means of thermal vaporization in vacuo at a pressure of approximately 10$^{-7}$ mbar, the vacuum not having being broken:
1) 40 nm N,N,N',N'-tetrakis(4-methoxyphenyl)-benzidine (MeO-TPD) doped with 2,3,5,6-tetrafluoro-7,7,8,8-tetracyanoquinodimethane (F4-TCNQ) in a molecular ratio of 50:1 as p-doped hole transport layer;
2) 10 nm N,N'-di(naphthalen-1-yl)-N,N'-diphenyl-benzidine (α-NPD) as intermediate layer;
3) 20 nm 2,2',7,7'-tetrakis-(N,N-diphenylamino)-9,9'-spirobifluorene (Spiro-TAD) doped with 20% iridium (III) tris (1-phenylisoquinoline) based on the mass;
4) 10 nm bathophenanthroline (Bphen) as intermediate layer;
5) 40 nm Bphen doped with Cs in a molecular ratio of 1:1 as n-doped electron transport layer; and
6) 15 nm silver as cathode.

This transparent red pin-OLED exhibits an emission maximum at approximately 620 nm. At an applied voltage of 3.4 V, the emission brightness is 1200 cd/m$^2$ in the case of a measurement by means of the ITO bottom electrode, whereas it is 380 cd/m$^2$ in the case of the measurement by means of the Ag top electrode. This corresponds to a ratio of 3.1. The optical transmittance of the component is between 60% and 70% in extensive parts of the visible spectrum.

The invention makes it possible to produce a transparent organic light-emitting diode whose different emission on the two outer sides is not based on the fact that a large proportion of the light generated in the light-emitting region is absorbed on its way through one of the two electrodes, which would lead to a reduction in the efficiency of the OLED. Rather, a difference in the emission intensity is realized by means of an increased reflectance of one electrode in conjunction with a high total transparency of the OLED.

The features of the invention which are disclosed in the above description, the claims and the drawing may be of importance both individually and in any desired combination for the realization of the invention in its various embodiments.

The invention claimed is:

1. Transparent light-emitting component, in particular organic light-emitting diode, having a transparent layer arrangement in which are formed, on a transparent substrate in a stack, planar electrodes and an organic region arranged between the planar electrodes, which organic region comprises a light-emitting layer, made from one or a plurality of organic materials, wherein:
   for at least one direction of incidence, a transmittance of the transparent layer arrangement for at least one wavelength subrange in the visible spectral range is greater than 50%;
   one of the planar electrodes has a metal layer having a thickness of less than 40 nm;
   another of the planar electrodes, which is arranged opposite to the electrode in the layer arrangement, has an oxide layer made from an electrically conductive oxide material having a thickness of at least 10 nm; and
   one or a plurality of doped charge carrier transport layers are formed in the organic region; characterized in that an intensity ratio of at least 2:1 is formed for a light emission emerging on one side of the transparent layer arrangement and a light emission emerging on an opposite side of the transparent layer arrangement and a coupling-out layer for coupling out light is formed on the electrode and/or the other electrode, wherein the coupling-out layer is made from an organic material.

2. Transparent light-emitting component according to claim 1, characterized in that the electrode and/or the other electrode is a multilayer electrode.

3. Transparent light-emitting component according to claim 2, characterized in that the multilayer electrode comprises at least one oxide layer made from an electrically conductive oxide material and at least one metal layer.

4. Transparent light-emitting component according to claim 2, characterized in that the multilayer electrode comprises a plurality of oxide layers made from in each case an electrically conductive oxide material and/or a plurality of metal layers.

5. Transparent light-emitting component according to claim 3, characterized in that one or all of the oxide layers of the multilayer electrode have a thickness of at least 10

6. Transparent light-emitting component according to claim 3, characterized in that one or all of the metal layers of the multilayer electrode have a thickness of less than 40 nm.

7. Transparent light-emitting component according to claim 1, characterized in that the coupling-out layer is electrically conductive.

8. Transparent light-emitting component according to claim 1, characterized in that the coupling-out layer has a refractive index of at least 1.3.

9. Transparent light-emitting component according to claim 1, characterized in that the coupling-out layer has a refractive index of at least 1.6.

10. Transparent light-emitting component according to claim 1, characterized in that a coupling-out layer is applied on a side of the transparent substrate which is remote from the organic region.

11. Transparent light-emitting component according to claim 10, characterized in that the coupling-out layer is formed by means of a coupling-out film.

12. Transparent light-emitting component according to claim 1, characterized in that, for the at least one direction of incidence, the transmittance of the transparent layer arrangement for at least one wavelength subrange in the visible spectral range is greater than 60%.

13. Transparent light-emitting component according to claim 1, characterized in that for the at least one direction of incidence, the transmittance of the transparent layer arrangement for at least one wavelength subrange in the visible spectral range is greater than 70%.

14. Transparent light-emitting component according to claim 1, characterized in that for the at least one direction of incidence, the transmittance of the transparent layer arrangement for at least one wavelength subrange in the visible spectral range is greater than 80%.

15. Transparent light-emitting component according to claim 1, characterized in that for the at least one direction of incidence, the transmittance of the transparent layer arrangement for at least one wavelength subrange in the visible spectral range is greater than 90%.

16. Transparent light-emitting component according to claim 1, characterized in that an intensity ratio of at least 3:1 is formed for the light emission emerging on one side of the transparent layer arrangement and the light emission emerging on the opposite side of the transparent layer arrangement.

17. Transparent light-emitting component according to claim 1, characterized in that an intensity ratio of at least 5:1 is formed for the light emission emerging on one side of the transparent layer arrangement and the light emission emerging on the opposite side of the transparent layer arrangement.

18. Transparent light-emitting component according to claim 1, characterized in that an intensity ratio of at least 8:1 is formed for the light emission emerging on one side of the transparent layer arrangement and the light emission emerging on the opposite side of the transparent layer arrangement.

19. Transparent light-emitting component according to claim 1, characterized in that an additional layer having a refractive index of less than 1.4 is formed between the transparent substrate and a planar electrode facing the transparent substrate.

* * * * *